United States Patent [19]

Cross

[11] 4,217,182

[45] Aug. 12, 1980

[54] SEMI-ADDITIVE PROCESS OF MANUFACTURING A PRINTED CIRCUIT

[75] Inventor: Joseph E. Cross, Springfield, Mo.

[73] Assignee: Litton Systems, Inc., Beverly Hills, Calif.

[21] Appl. No.: 913,281

[22] Filed: Jun. 7, 1978

[51] Int. Cl.$^2$ .................... C25D 5/02; C25D 5/56; B05D 5/12; B05D 3/00

[52] U.S. Cl. .................................. 204/15; 427/98; 427/306

[58] Field of Search ............... 204/15, 30, 38 B, 38 E; 427/98, 305, 306, 307; 156/659, 666

[56] References Cited

U.S. PATENT DOCUMENTS

| | | | |
|---|---|---|---|
| 3,615,736 | 10/1971 | Stone | 106/1.25 |
| 3,625,758 | 12/1971 | Stahl | 428/206 |
| 3,628,999 | 12/1971 | Schneble, Jr. | 427/98 |
| 3,635,758 | 1/1972 | Schneble, Jr. | 427/98 |
| 3,694,250 | 9/1972 | Grunwald | 427/305 |
| 3,854,973 | 12/1974 | Mersereau | 428/413 |
| 3,865,623 | 2/1975 | Allen, Jr. | 427/98 |
| 3,874,897 | 4/1975 | Fadgen | 106/1.11 |
| 3,930,963 | 1/1976 | Polichette | 204/15 |
| 3,956,041 | 5/1976 | Polichette | 156/630 |
| 3,960,573 | 6/1976 | Zeblisky | 106/1.11 |

Primary Examiner—T. M. Tufariello
Attorney, Agent, or Firm—Robert A. Seldon

[57] ABSTRACT

A method of making a printed circuit board from a laminate structure comprising an insulative laminate base, a layer of semi-cured adhesive material, a layer of electroless copper and an electroplating resist covering the surfaces in the negative of the image of the desired conductor configuration which comprises immersing said resist covered structure in an acid cleaning solution for cleaning said structure; immersing said laminate structure in an acidic copper electroplating solution and coupling an electrical source to said structure for electroplating acid copper onto the exposed portions of said electroless copper and retaining said structure in said solution for an interval sufficient to produce a plating of electroplated copper of a thickness in the range of 0.0005 to 0.005 inches; immersing said structure containing said electroplated copper in a stripping solution for an interval of time to remove said resist material and expose an embossed surface of metal in which the electroplated copper forms a raised portion of the embossment and is in the positive image of said desired conductor configuration and in which the electroless copper forms the recessed portion of said embossment; immersing said structure containing said embossed surface of copper material in a copper etchant solution for differentially etching said electroless copper and said electroplated copper for an interval sufficient to remove the electroless copper in the recesses of said embossment without significant removal of said electroplated copper and for removing traces of catalyst. And a circuit board produced according to the above-recited process.

27 Claims, 2 Drawing Figures

Fig_1

SEMI-ADDITIVE PROCESS OF MANUFACTURING A PRINTED CIRCUIT

BACKGROUND OF THE INVENTION

The present invention relates to a process for fabricating printed circuit boards, sometimes referred to as printed wiring boards, and, more particularly, to a "semi-additive" process for producing circuit boards and apparatus for practicing that process which uses steps of addition and subtraction of copper.

Printed circuit boards are known electronic component structures which contain copper strips or paths arranged in a pattern on a relatively flat electrically insulative structure or base. The copper strips form current-conducting paths, the electric wiring, by means of which other electrical components thereafter mounted on the board may receive or pass electrical current to other electrical components, similarly mounted, or from a power source. These circuit boards are notoriously old and well-known, having achieved wide application in all kinds of electronic devices, including radios, televisions, and computers, to name a few, and various types and processes provide pertinent background to the present invention.

One circuit board structure is referred to as a two-sided plated through-hole board. The board contains electrical conductors on its front and back surfaces, and at least some of those conductors on opposite sides are electrically inter-connected by means of the plated "through-hole" connections. The through-hole is a hole formed through the board between intercepting conductors on the opposite board sides and the hole wall is plated with metal electrically connecting the two conductors. A number of these circuit boards may be laminated or bonded together to form what is known as a multilayer printed circuit board, and in such multilayer circuit board aligned through-holes may form electrical connections to different circuit boards in the bonded stack. A less complex printed circuit board is a single-sided plated through-hole circuit board in which a through-hole is drilled through the board and plated with metal even though a conductor circuit pattern appears on only one board surface. This configuration is often desired because it assists in soldering of components to the board and that advantage justifies the additional cost to some users over single-sided boards having unplated component mounting holes.

Prior art manufacturing processes are characterized as subtractive or as additive processes. Still others, as the present invention, are characterized as semi-additive. An example of a subtractive process for a single-sided board is one in which a copper foil, usually relatively thick, is applied to an insulating base substrate, desired mounting holes are formed therein, and an etch-resist material is applied or formed over the copper layer in the positive image of the desired circuit configuration. The board is immersed in a copper etchant that removes the copper from the areas unprotected by the resist. Thereafter, the etch-resist material is removed to expose the protected copper, leaving the desired electrical circuit configuration. Because the copper layer is relatively thick, a strong etchant and considerable time is required to accomplish the fabrication and much copper is obviously wasted in being etched away.

Where plated through-holes are required, the foregoing subtractive process is modified in an "additive" way by forming the holes and then electrolessly plating over the copper covered laminate to coat the thick copper layer and the hole walls. An etch-resist is then applied over the electroless copper surface in the negative image of the desired pattern and copper is electrolytically applied to the desired thickness. Then a dissimilar metal-resist pattern is applied over the portions of the copper surface to be retained, typically by electrolytic plating of a nickel metal or a solder metal (tin-lead), to cover the plated hole walls as well, and in the subsequent step of etching, generally only the undesired copper is removed. It is apparent in this essentially subtractive process, even greater amounts of copper must be etched away, including some of that expensive electroless copper deposited over the copper layer. Moreover, there is greater waste, hence expense, in that copper is built up on those areas of the laminated copper layer where it was not needed and expensive metal-resist is required over large areas.

A purely additive process is one where an insulating base substrate is masked in the negative image of a desired conductor configuration and treated and then receives a deposit of copper on the substrate surfaces only in those areas where the desired circuit configuration is desired, usually accomplished in part by immersion in an electroless copper bath.

The relative advantage and disadvantage of each of these processes as industrially applied is generally known: The subtractive process producing circuit boards in which the copper is firmly attached to the insulating base with the greatest "peel" strength, the measure of adherence of the bond, whereas with the additive processes presently available to industry, the desired levels of peel strength between the copper and insulating base substrate have not, in my opinion, equaled that available with the subtractive process on a production basis or at reasonable cost. Conversely, the subtractive process involves extensive etching of thick copper material with much waste of copper and long etching requirements, particularly in those structures as described requiring plated through-holes, and in times of rising copper prices this is a significant factor for the consumers. Moreover, due to a phenomenon known as "undercutting" in the subtractive process, in which the etchant etches sideways into the sides of the resist covered copper areas during etching in addition to etching down into the uncovered copper areas the desired direction, the width or "fineness" of a conductor line on a printed circuit board made by the subtractive process is necessarily limited, whereas finer conductor lines, those of ten mils or less in width, may be made using a purely additive process. This is significant since the line width serves as a limit on the density of conductor circuits which can be placed on the circuit board. In addition, undercutting reduces the area over which the plated line contacts the base and thus reduces the peel strength, which is somewhat proportional to the contact area.

Another consideration is that the subtractive process utilizing electroplating techniques produces a ductile copper deposit which withstands temperature shocks induced by soldering and/or temperature extremes without cracking. Additive processes have been both technically and economically limited in this regard: The quality of copper deposited appears less consistent and does not routinely withstand temperature shock testing over a period of time.

By way of specific example, certain patent literature has been made known to me which describe additive and subtractive processes and parts and intermediate processes, many of which may never have been industrially adopted but which are considered prior art and the reader's attention is invited to these as further background:

U.S. Pat. No. 3,930,963, issued Jan. 6, 1976, to Polichette et al;

U.S. Pat. No. 3,625,758, issued Dec. 7, 1971, to Stahl et al;

U.S. Pat. No. 3,956,041, issued May 11, 1976, to Polichette et al;

U.S. Pat. No. 3,854,973, issued Dec. 17, 1974, to Mersereau et al;

U.S. Pat. No. 3,694,250, issued Sept. 26, 1972, to Grunwald et al;

U.S. Pat. No. 3,628,999, issued Dec. 21, 1971, to Schneble et al;

U.S. Pat. No. 3,874,897, issued Apr. 1, 1975, to Fadgen et al;

U.S. Pat. No. 3,960,573, issued June 1, 1976, to Zeblisky et al;

U.S. Pat. No. 3,635,758, issued Jan. 18, 1972, to Schneble et al;

U.S. Pat. No. 3,615,736, issued Oct. 26, 1971, to Stone et al;

U.S. Pat. No. 3,865,623, issued Feb. 11, 1975, to Allen et al;

the disclosures of which are referred to and incorporated herein by reference for the processes, the chemical ingredients and the equivalents they disclose.

Considering the large number of concerns which produce printed circuit boards on a low and on a high volume basis and the ready availability of circuit boards at reasonable cost and acceptable quality, as well as the numerous process variations available to the industry evidenced by the afore-cited prior art patents, the reader recognizes that the art of manufacturing printed circuit boards is fairly well developed and an almost limitless variety of possible alternative and substituent ingredients in these processes exist at least as proposals, as is made more apparent later in this specification. With the great variety of technology one skilled in the art conceivably could experiment with each possible permutation of ingredients suggested or proposed by the prior art in an attempt to define ingredients, parameters and ranges as an attempt to define an industrially acceptable high volume printed circuit board of comparable or better quality than those available, and yet, though quality is achieved, the person may ultimately discover that the processes taught by the prior art, uncovered and evaluated through great effort, is uneconomical on a high volume basis in competition with other known printed circuit board manufacturing processes or produces a slight increase in quality but at an unacceptable increase in cost and so as to render the product of his efforts unsaleable. In this respect, the reader appreciates the scientific work of those skilled in this field, particularly in additive processes, whose obvious curiosity and desire to enhance the quality and use of circuit boards has resulted in many achievements in ingredient chemicals and treatments used in the manufacture of printed circuit boards heretofore, including those without which the present invention would not be possible. However, those additive processes which have been made industrially available, though recognized as an apparent accomplishment, does not, in the opinion of applicant, produce circuit boards that are competitive with the subtractive process on a cost and quality basis, the first serving to limit the extent of the market for circuit boards produced in that manner and the latter serving to reduce yields and hence increase costs. Hence, the availability of circuit boards containing high density circuits with very thin lines sufficiently bonded to the board is based upon the payment of a substantial premium and hence is likely to be limited to a lower volume market than desired as a natural consequence of the inherently higher price.

By way of more specific background to the present invention, patent U.S. Pat. No. 3,930,963 to Polichette et al discloses an additive process for manufacturing printed circuit board which commences with an epoxy glass laminate base material which is put through a series of chemical treatment steps, including treatment in an absorber, drying, rinsing, punching holes, pre-activation, draining, oxidizing, and reducing to render the board surface microporous. That is followed by removing excess agents, poisoning, and applying a layer of a reducible metal compound, masking and exposing the compound to ultraviolet light, and rinsing away the unexposed salts to leave a metal "positive" image of the desired copper conductor configuration. This is followed by electroless plating and additional plating, such as electroplating to a thickness of 0.001 to 0.003 inches.

In an alternative treatment therein described, the insulative base material is passed under a "curtain coater" and covered with an oxidizable adhesive layer which is then dried at a temperature of 160 degrees for about one hour, and the "through-holes" are punched out of the base. The base is then immersed in an oxidizer to produce a microporous surface in the adhesive layer. This appears similar to that described in the patent cited in the paragraph which follows. The board is then rinsed, neutralized in an acidic sodium bisulfate solution followed by the application of the poison layer and then the board is coated with the radiant energy sensitive reducible metal salt layer. The additional steps for building up the thickness of the copper thereafter is followed.

Another patent, U.S. Pat. No. 3,625,758, issued Dec. 7, 1971 to Stahl et al, owned by Photocircuits Division of Kollmorgan Company, describes a number of semi-additive processes for making two-sided printed circuit boards containing plated through-holes. In one, which Stahl refers to as prior art, an insulating base has a thick electrolytic copper foil laminated to the surfaces of the substrate, followed by drilling of the through-holes, activation of the substrate with silver nitrate or tin and noble metal ions activating solution and then depositing electroless copper on top of the copper foil and on the walls of the formed holes, accomplished by immersion in an electroless copper plating solution. Thereafter, a first protective coating is applied to the formed board in the negative image of the desired conductor configuration leaving exposed those regions of the electroless copper corresponding to the desired conductor configuration. A copper layer is then electroplated on top of the exposed electroless copper portions, including the hole walls. Thereafter the treated substrate is electroplated with an etch-resistant second protective coating, such as silver, tin, lead or gold, to cover the surfaces of the electroplated copper applied in the previous step. The first protective layer is removed and the structure is immersed for a time in a copper etchant which removes the uncovered electroless copper and the underlying thick copper foil, the second protective coating protecting, generally, the other underlying copper portions from the etchant. The copper underlying the second protective coating forms the desired conductor configuration on the circuit board. The described method is characterized in the text of the patent as expensive with respect to the amounts of copper to be etched and to the large amount of equipment required to perform the process. Further, the etch-resistant second metal protective coating and its application adds to cost.

The U.S. Pat. No. 3,625,758 Stahl patent describes another semi-additive process by way of improvement which is relevant to the instant invention, in which an insulative base substrate material, such as phenolic paper board or the like, is brushed or sanded to clean and roughen the surface and treated with suitable activating solutions for the electroless deposition of copper. Thereafter the entire surface is provided with a thin layer of electroless copper which covers all the surfaces and the hole walls to a thickness, which applicant speculates upon as between 25 to 35 microns. Thereafter, a coating is applied to the surface of the board in the negative image of the desired conductor configuration for the circuit board to be formed leaving exposed the electroless copper in the desired locations. Thereafter the structure is electroplated with copper to build up the thickness of the copper in the desired area. The protective layer is then removed, such as with a stripping solution, and the uncovered electroless copper is etched away, although such etching is not particularly described, leaving the desired conductor configuration. Stahl notes that the method avoids the application of unnecessary copper but has a serious drawback of lack of sufficient bond between the surface of the base material and the copper conductors, which applicant concludes as teaching the process to be unacceptable, and notes proposals to make the previously defined process acceptable, eliminating that defect with additional process steps by equipping the surface of the insulating material with an adhesive and subjecting the completed board to a heat hardening and pressing process requiring expense in manufacturing equipment, processing, as well as imposing greater demands upon manufacturing personnel. Stahl notes that it is frequently necessary to add an electroplated protective coating on top of the original electroless copper coating unless extreme cost increasing care is to be taken in handling the semi-finished product, all of which leads to complication and higher price of production for the finished product which have rendered that process almost noncompetitive with that produced by the copper foil etching methods previously described in Stahl. To remedy that, Stahl proposes an improved structure for the base material and then illustrates such product in various semi-additive processes to achieve sufficient bond between the copper conductors and the board at an asserted competitive manufacturing cost.

In this, a suitable base, such as phenolic paper, epoxide paper, epoxy fiberglass laminates and the like, is provided with a layer which firmly adheres and which can be hardened by heat and contains at least one substance which is uniformly distributed in the layer and belongs to the group of modified rubbers or synthetic rubbers and can be oxidized and degraded by suitable oxidizing agents to form a microporous surface suitable for the deposition of electroless copper. The thickness of this coating is noted as 10 to 30 microns.

In one process, Example V in Stahl, a prepared base material, according to his Example IV, is treated in an acidic stannous chloride solution, an acidic palladium chloride solution and immersed in an alkaline electroless copper plating solution to build a thin copper foil of between 3 and 6 microns thickness over a period of 45 minutes to one hour and a half. From that, a solvent strippable ink mask is applied in the negative image of the desired circuit pattern and immersed in an electroless copper plating bath until the exposed copper is built up to desired thickness. The mask is removed in a "customary manner" and the underlying foil is removed by brief treatment in ammonium persulfate or other suitable solvent. This infers that the alkaline copper etchant as a consequence must remove some of the conductor as well at the same etching rate, although not clearly stated, a fact most relevant to the process of my invention. In another process, Example VI, using the improved base structure of Example V having electroless copper plating layer of about 5 microns thickness on the substrate, a protective solvent removable ink mask in the negative image of the desired conductor configuration is applied, the board is then cleaned in an alkaline solution, rinsed, reactivated in an acid solution and then immersed in an electroless copper bath to deposit additional electroless copper and build up the conductors to a thickness of 35 microns in a period of fifteen hours. This is followed by dissolving the mask. Although not clear from the patent, it is assumed that this is followed by removal of the exposed electroless copper in an etchant, ammonium persulfate, such as given in the earlier example, which necessarily etches the conductors also.

Commencing with the masked board as derived in his Example VI, in an Example VII an alkaline (i.e. caustic) copper electroplating solution, suitably pyrophosphate-copper, is used to build up the thickness of the exposed copper in the areas unprotected by the ink mask, to 35 microns in about 45 minutes, as an alternative to the electroless copper. In this example it is stated that the mask is removed and that the thin base copper exposed by removal of the mask is dissolved, although particular details are not given. It is possible to infer that the method exposes the electroplated copper also to the etchant, much like in my invention. Stahl also notes that in his processes he has found it particularly advantageous to use masking inks which are dissolved or stripped in an alkaline solution in connection with electroless copper plating to build up the conductors which in the previous examples were all alkaline based electroless copper plating solutions and which one would believe would dissolve or strip the mask. This prior art proposal of Stahl thus leaves some ambiguities. However, with all the ambiguities the Stahl disclosure is most pertinent to the invention.

One recognizes from the foregoing examples of Stahl that copper electroplating is more rapid than electroless copper plating. Hence, if time is equated with expense, electroplating is an obvious favorite. Despite the advantages asserted in the Stahl patent, I have not learned of any industrially available process which uses the process of Example VII and the like to produce acceptable quality circuit boards at competitive prices and know only of the efforts of the patent owner to promote practice of fully additive processes, which in my opinion suffers from the high cost and lower quality inherent in such processes, using the laminate treatment described in the patent, and assume that the work forming pertinent background to my discovery was regarded by the patent owner as less attractive than the additive processes which the patent owner promotes.

The Mersereau patent, U.S. Pat. No. 3,854,973, granted Dec. 17, 1974, owned by MacDermid Company, describes many printed circuit board manufacturing techniques. One of these involves initially immersing the base substrate in an organic solvent, for example one which includes dimethyl sulfoxide, followed by immersion in an appropriate chromic sulfuric oxidizing solution and thereafter catalizing of the board with an appropriate electroless plating catalyst. Thereafter it is suggested that the board be subjected to direct electroless plating by applying a thin initial deposit of conductive metal over the entire surface of the board followed by the application of a plating resist or mask and its development to form a suitable negative image of the desired circuit pattern. This is followed by further electrolytic plating or electroless deposition of conductor metal to build up the thickness of the conductor configuration. Then a different protective metal etch "resist" layer, such as nickel or tin-lead, is deposited over the conductors. The plating resist is removed, exposing the underlying electrolessly deposited copper followed by immersing the board in an etching solution to remove the initial thin continuous coating of the conductive metal. Thereafter the protective metal coating may be removed from over the copper or, I assume, alternatively left in place. The protective metal resist obviously can be equated with an expense. An alternative process described in the patent is to form a positive resist image directly on the bare board and to electrolessly deposit copper on the exposed portions up to the desired thickness. This appears as a purely additive process. In either procedure, U.S. Pat. No. 3,854,973 recommends that either before or after plating, the base substrate is baked to promote effective bonding between the conductor and the base substrate.

One variation which may seem obvious is to use the adhesive layer described in the cited U.S. Pat. No. 3625,758 to Stahl or an equivalent substance as a substitute for initial treatment in the process described in the cited U.S. Pat. No. 3854,973 where a coverall copper layer is electrolessly deposited on the board, but in fact the mating of the two different processes to produce an industrially acceptable printed circuit board, as is apparent to one skilled in the art, is intrinsically difficult to accomplish and, in my opinion, is not obvious. And even if successful, that process includes the addition of a metal resist as therein described.

Against the foregoing background of suggested processes of additive or semi-additive types with which the present invention is concerned and the different specific examples of treatment, applicant was not presented with any complete industrial additive or semi-additive process for producing circuit boards that produce the combination of peel strength and cost competitiveness with boards produced by industrially available subtractive manufacturing processes.

The cost of producing printed circuit boards of acceptable quality depends upon many factors, including the cost of materials and chemicals, the cost of equipment, and the cost of labor and handling, as well as the ultimate process "yield", the portion of acceptable quality boards from all the boards emerging from the treatment process. In connection with process yield is the permissibility of salvaging those circuit boards produced which do not meet the quality standards.

Circuit boards made by the subtractive process are not effectively "salvageable". This is, if after processing the resultant board is defective and no manual repairs are permitted, it is virtually impossible economically to etch off the thick copper and apply a new copper layer to reprocess the board. Boards produced by the subtractive process rely upon the strong bond between the copper layer and the circuit board as applied by the laminating company that originally manufactured the board and copper foil combination and this is done on a high volume basis to be economical.

In respect of the additive processes I have found that at least one of the processes is not salvageable. This is a process in which an aluminum sheet is laminated to a circuit board and oxidized to create a surface roughness. The aluminum layer is then chemically stripped from the board so as to leave the rough surface for electroless copper plating and the like. However, in attempting to salvage circuit boards undergoing that process, after all the copper is stripped from the board, for unknown reasons, it appears impossible to effectively replate copper on the base material. However, that may not be the case with all additive processes since I have not had time or interest to experiment with all of them. For example, one process relies upon a surface catalyst which is activated by treatment of the base material in a chrome solution. In that process, after all the plated copper is stripped from the board to be salvaged, the teaching is that the board is reintroduced into the chrome solution and that solution replenishes the surface catalyst. However, I have not actually practiced such an operation and I believe the process overall to suffer the same disadvantages of additive processes hereinbefore described by way of background to the present invention.

The translation of the prior art knowledge into an improved commercially viable industrial application has thus been wanting, in applicant's opinion.

SUMMARY OF THE INVENTION

Therefore, an object of the present invention is to provide a high volume manufacturing process including apparatus to practice such process for producing printed circuit boards in a semi-additive manner which results in a commercially acceptable product competitive in price, thermal shock capability, and in peel strength quality with circuit boards produced by conventional subtractive processes and which has a greater capability for producing conductor lines more narrow than the subtractive process, much like that inherent in a fully additive process. An ancillary object of the present invention is to provide a semi-additive circuit board manufacturing process which permits easy salvage of circuit board materials. A still further object of the invention is to provide a semi-additive circuit board fabricating process which minimizes handling and labor time. A related object is to provide a circuit board having a characteristic quality of increasing conductor peel strength during use.

The present invention relies upon a unique combination of existing technology and adapts existing technologies associated with additive processes to provide a unique semi-additive manufacturing method combined with processing apparatus in which labor and handling of printed circuit boards during processing is minimized so as to significantly reduce production cost and enhance reliability and which enhances the salvageability of circuit board materials for reprocessing. Surprisingly, I have also discovered that the practice of my unique process results in printed circuit boards which have conductor strips attached with peel strengths equal to or greater than those attained in subtractive processing and in excess of the industry standard of eight pounds per inch. And I have discovered further also that the peel strength increases unexpectedly when the board undergoes wavesoldering in use.

Beginning with an insulating base material, such as conventional glass epoxy or phenolic paper laminates, an adhesive layer of the type intended to receive and hold a surface coating of electroless copper is applied to the base material surfaces and semi-cured to a desired tackiness, the thickness of this adhesive layer suitably is on the order of 0.0005 to 0.002 inches. Thereafter the holes are formed through the board at the desired locations and the board surfaces are cleaned and lightly abraided. The surfaces of the board are then metallized by electroless copper deposition procedures, including pretreatment with a catalyst, to form a thin electroless copper layer on the surfaces and on the walls of the formed holes, the layer being within the range of approximately 15 to 50 millionths of an inch thickness. Thereafter, a resist material, such as an alkaline strippable resist material, is applied over the copper layer to provide a negative image of the desired circuit configuration on the board, leaving exposed electroless copper in those areas in which the conductor strips are desired. In the related invention the treated board is applied to chemical treating apparatus in which the treated board is automatically moved to different chemical baths in the defined process sequence which follows in my process. In the process sequence, as may be automatically performed by the apparatus, the board is cleaned in an acid bath and may be thereafter electrocleaned to remove some small amount of electroless copper and any residual oils or surface dirt; then it is immersed in an acidic electroplating copper solution to plate an additional thickness of electroplated copper on top of the exposed electroless copper patterns to a total thickness in the range of 0.0005 to 0.005 inches, typically 0.0014–0.0025 inches; immersion in a rinsing bath; immersion in a resist stripper, such as a caustic stripping solution, for removing the resist material; immersion in a rinsing bath and then in a mildly acidic bath to coat the board with an acid, and is thereafter advanced and immersed into a copper etchant solution for a short period of time, primarily to etch out the thin electrolessly deposited copper exposed upon the removal of the resist material in a preceding step so as to bare the insulating substrates in those areas where the circuit configuration is not desired and leave a relatively thick conductor material in those areas where the conductor configuration is desired, which I characterize as "differential etching", and secondarily to remove excess catalyst presented as part of electroless copper deposition steps.

In a related aspect, any defective boards are immersed in a strong copper etchant to remove the relatively thick copper strips, leaving a bare base substrate with the adhesive layer and with the formed holes. The base substrate is then reprocessed commencing with reapplying a covering copper layer in accordance with the foregoing steps.

My product invention may be regarded as any of the circuit boards resulting from the practice of the foregoing process and variation thereof.

The foregoing objects of the invention, as well as the detailed steps and apparatus characteristic thereof, briefly summarized above, are better understood by making reference to the detailed description of a preferred embodiment of the invention which follows in this specification, considered together with the figures of the drawings illustrative thereof.

DESCRIPTION OF THE PREFERRED EMBODIMENTS

Figure 1:
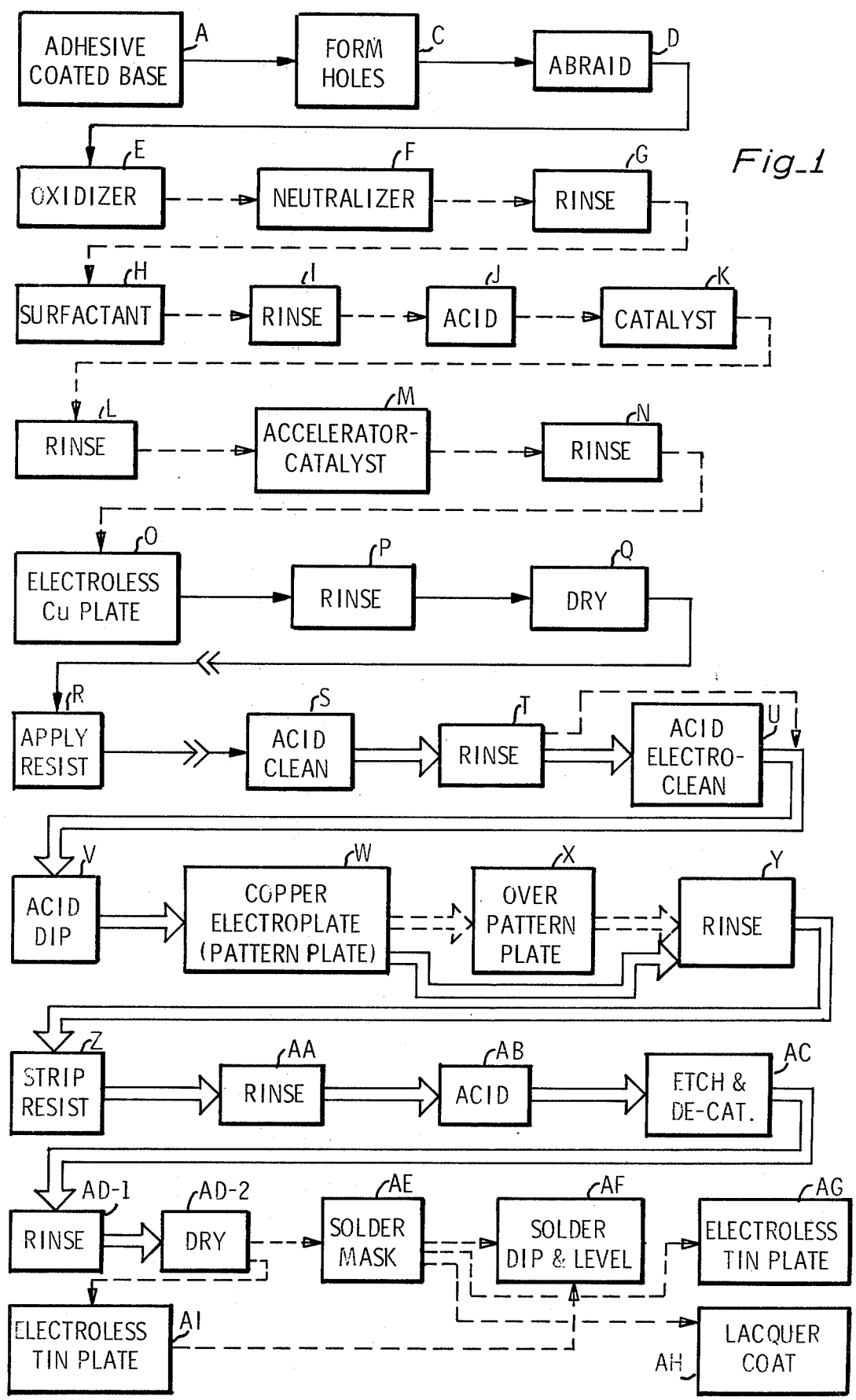
FIG. 1 illustrates in block diagram the steps of a preferred embodiment of my process invention.

With reference to FIG. 1 of the accompanying drawings, the various steps in my process for making a printed circuit board are illustrated in the form of a flow diagram, particularly with respect to making a two-sided plated through-hole board and the following discussion thereof may be considered as a specific example of the practice of the invention as well as an enabling description of same. The process commences with a sheetlike base material or substrate to which an adhesive layer is applied, represented at A. The base material is of an electrically insulative characteristic of any type commercially available for circuit board purposes, such as, by way of example, the molded thermoset resin of glass epoxy laminates, known as G10, or phenolic base types, some or all of which are sold under the trade designations AL-910, FR-2, FR-3 and CEM. As represented, an adhesive resin coating layer is applied and firmly bonded or attached to each of the planar top and bottom surfaces of the base material which are to receive the conductive patterns. This is applied in accordance with conventional practice, such as by a curtain coating method, such as is described in U.S. Pat. No. 3,625,758, or a transfer coating process, such as is described in U.S. Pat. No. 3,956,041, issued May 11, 1976, both of which are referred to and incorporated herein. By way of example, the adhesive layer may comprise a material having dispersed therein finely divided particles of rubber or synthetic rubber which are oxidizable or otherwise chemically degradable, the purpose of which is to render the surface of the adhesive layer microporous after treatment, which, in accordance with prior art teachings, serves to enhance the strength of the bond between electrolessly deposited copper and the adhesive layer. Examples of such material are nitril rubbers, butadiene styrenes, available from the B. F. Goodrich Company under the trademark "Pliobond", and other examples and its application may be found listed in Column 4 of U.S. Pat. No. 3,625,758, such as:

| Resin Mixture 1: | |
|---|---|
| Toluene | 50 g. (grams) |
| Diacetone alcohol | 50 g. |
| Butadiene-acrylonitrile rubber | 11 g. |
| Oil-soluble phenol formaldehyde resin | 7.5 g. |
| Cab-O-Sil (finely divided $SiO_2$) | 20 g. |
| or | |
| Resin Mixture 2: | |
| Epoxy resin | 15 g. |
| Butadiene-acrylonitrile rubber | 15 g. |
| Diacetone alcohol | 50 g. |
| Toluéne | 50 g. |

-continued

| | |
|---|---|
| Oil-soluble phenol formaldehyde resin | 11 g. |
| Cab-O-Sil (SiO$_2$) | 25 g. |
| or | |
| Resin Mixture 3: | |
| Butadiene-acrylonitrile rubber | 15 g. |
| Clorinated rubber (viscosity 10 c.p.s.) | 20 g. |
| Diacetone alcohol | 75 g. |
| Nitromethane | 70 g. |
| Oil-soluble phenol formaldehyde | 10 g. |
| Ethanol | 10 g. |
| Cab-O-Sil (SiO$_2$) | 7 g. |
| Xylene | 50 g. |

The applied adhesive resin layer is "semi-cured" or tacky, to provide an optimal load in the range of 30 to 200 grams, preferably 50 to 100 grams, 75 grams average, as measured by an "Erickson" tester, a measuring device known in the art. Ideally, the thickness of the adhesive layer is in the range of 0.0005 to 0.0020 inches in thickness, averaging 0.0008 inches. Typically, the foregoing adhesive resin application is accomplished by a supplier of the base material having specialized equipment for that purpose and in this sense the process of my invention may be considered to begin with the resin coated base material or board.

The "through-holes" are formed in the coated board at the locations desired, as represented at C. Any conventional drilling or piercing operation is used to form the holes. The holes are arranged in a prearranged pattern selected by the designer and specified by the customer or user, which in turn is dependent upon the ultimate circuit configuration to be produced on the board, as is known to those skilled in this art. As represented at Step D, the surfaces are then cleaned in water and roughed with a wire brush or "Scotch-Brite" brand brush to slightly abraid the surface.

Subsequently, the coated base laminate board is covered with electroless copper, represented generally by the sequence E through O in FIG. 1. By way of specific example, the board is immersed in an oxidizing chromate solution, such as approximately 100 gram/liter chromic acid flakes and 30–40% volume sulfuric acid at a solution temperature of 110 degrees F. to 130 degrees F. for a maximum of eight minutes and a minimum of three minutes to selectively remove the rubber component of the adhesive to therein form pores, as at E, followed by immersion in a neutralizer solution of sodium bi-sulfite of a concentration of $\frac{1}{2}$–$1\frac{1}{2}$ pounds per gallon of water at room temperature, as at F. A suitable neutralizer is #12044, available from Enthone Company, Westhaven, Connecticut. The neutralizer reduces the chrome $+6$ to chrome $+3$, which chrome $+3$ is more easily removed as is hereinafter accomplished. Other ways of neutralizing known to those skilled in the art may also be employed. Alternatively, an alkaline permanganate solution may be employed to accomplish the same results. If desired, the board may be immersed in a water rinse bath, not illustrated, in between Steps E, the oxidizer, and F, the neutralizer.

The treated board is subjected next to a water bath rinse, as at G. Then the board is immersed in a surfactant (wetter) solution which is at room temperature, such as the solution of Enplate 50104 available from Enthone Incorporated, for three to eight minutes, as at H, rinsed in a water bath, at I, immersed in a hydrochloric acid solution at room temperature, 30% HCl by volume max., remainder water, as at J. The surfactant in Step H wets the material and glass fibers of the board material to allow uniform catalyzation and the hydrochloric acid solution replenishes the catalyst acid in Step K, which acid is dragged out when the board is removed from the catalyst. The board is then immersed in a catalyst, such as a colloidal tin-palladium complex, acidic in character, disclosed by way of example in U.S. Pat. No. 3,874,897, issued Apr. 1, 1975, and others, Enplate 442 or MacDermid 9070, as represented at K, and immersed in water to rinse at L, and is next immersed in an accelerator solution which is at room temperature for approximately two to five minutes, as at M. The accelerator in Step M comprises a mild hydrochloric acid, HCl, solution or a mild fluoroboric acid solution or a combination of the acids with tin and palladium so as to serve also as a catalyst, a second catalyst in my process. Examples of such are available from Enthone as Enplate 440 or MacDermid Company as 9071. The accelerator serves to remove the tin from the palladium, exposing a fresh surface of palladium to allow copper deposition.

This is followed by another immersion of the board in a water bath for rinsing at N. As represented at O, the board is then immersed in an electroless copper plating bath conventional in the art. The board is retained in the plating bath for a period of time sufficient to deposit a thickness of copper on the surfaces of the board, including the walls of the holes which were formed in the previous Step C, to a thickness in the range of 15 to 50 millionths of an inch, typically 30 millionths. By way of a specific example, the electroless plating solution may be one of formaldehyde and caustic and a copper sulfate salt with appropriate stabilizer and complexers, such as EDTA. "Enplate Q524" provided by the Enthone Company, or MacDermid Company's "9027", or as described in U.S. Pat. No. 3,615,736, issued Oct. 26, 1971, and U.S. Pat. No. 3,635,758, issued Jan. 18, 1972, are examples.

Although non of the adhesive material which was applied to the flat surfaces of the board was applied to the hole walls, the hole wall topography is inherently very rough due to the mechanical action of drilling or piercing. Hence, the hole walls have the necessary surface characteristic to receive and firmly secure the electroless copper during the described step.

After electroless plating at O the board is washed in water at P and then dried, such as by heating in an open tank for 10 to 20 minutes at 150 degrees F., as represented by Q. Then a resist mask or coating is applied to the surfaces of the board, as at R. The resist is placed on the surfaces in a mosaic or stencil-like configuration to form the negative of the image of the conductor configuration desired on the front and back board surfaces. Thus, the portions of the thin electroless copper plating which remain exposed after application of the resist represents the desired conductor configuration. The resist is applied by a conventional silk screen process. The resist may comprise a strippable ink, paint or resin paint which may have the physical characteristics of being curable, changing from the fluid or plastic state to a solid or hardened state and in the preferred embodiment is strippable by immersion in an alkaline (caustic) solution. By way of example, one such resist resin is type 7263, available from the Grace Company of Columbia, Maryland, and comparable resists of other manufacturers are known as MacDermid 9403 and Dynachem SR-20. The resist materials of this example are ultraviolet light curable and suitable UV or ultraviolet light curing equipment is commercially available for this step. Hence, the resist applied in the fluid state is then exposed to ultraviolet light and cured in this step. By way of further example, conventionally heat-cured alkaline strippable resist material, such as Wornow PR-3003, is an alternative and which is exposed to heat to cure or harden the fluid.

It is noted that fully aqueous dry films may be substituted as resist in my process as an alternative. Such dry films are applied and developed to produce the desired image and in my process, like the other resists, is alkaline strippable.

As represented at S, the treated board is next immersed into a cleaning solution, which must be an acid solution according to the invention, to remove soil and copper oxides formed on the electroless copper during the preceding steps of applying the resist. MacDermid 9268, containing phosphoric acid, available from the MacDermid Company, 20 percent by volume in water, is a suitable acid solution, by way of example, and typical immersion is for ½ to 4 minutes at a solution temperature of 100°–120° F.

Although I believe that many skilled in the art use a cleaning solution to clean the board after application of the resist, those that do appear to use an alkaline (caustic) solution. Thereafter, the board is rinsed in water, as represented at T, typically for 1 to 3 minutes at a water temperature of room temperature.

Next, as represented at U, the resist coated board may be immersed in an acid solution and connected to a source of electrical potential to accomplish electrocleaning of the board. In this, the board is connected to the positive terminal of the current source so that the board is an anode and the bath and tank are placed to the negative terminal of the current source. Electrocleaning exposes fresh copper by removing between one and five millionths of an inch of the exposed electroless copper from the treated board effectively partially "deplating" the board in the areas not covered by the resist. A suitable acid solution for Step U is MacDermid 9268, available from the MacDermind Company, 5 to 10 percent by volume in water under a reverse current of between 5 to 10 ASF for between 3 and 10 seconds. Thereafter at Step V, the board is immersed in a moderately acidic bath, suitably containing sulfuric acid, for example, a 8–12 percent by volume sulfuric acid solution, for a time of 1 to 3 minutes at room temperature.

A variation of my process is noted. If electrocleaning is not necessary or desired, the step may be bypassed entirely, proceeding from Step T to Step V directly or, if desired, an additional acid cleaning step, immersion in a simple cleaning solution, may be substituted.

After Step V, the board is next carried and immersed into an electroplating solution containing an acid based copper solution for electroplating or "pattern plating", as variously termed, in order to build up the thickness of the copper connection. An acid based copper electroplating solution is one which uses an acid solution, such as sulfuric acid, in which copper is dissolved. There are many commercially available acid based copper electroplating solutions, usually containing additives, such as grain refiner or brightener suitable for the process, such as the Copper Gleam PC, Lea-Ronel, of Freeport, L.I., New York, or Cuflex 339 solution available from the McGean Chemical Company of Cleveland, Ohio. A suitable electroplating solution comprises 7 to 13 ounces of copper sulfate pentahydrate ($CoSO_4 \cdot 5H_2O$) per gallon solution, 40 to 90 ppm Chloride, and 20 to 26 ounces Sulfuric acid ($H_2SO_4$) per gallon solution and ½ to 2 percent by volume conventional additives with the remainder of the solution water ($H_2O$).

As is conventional in electroplating, the negative terminal of an electric current source is connected to the thin copper layer of the circuit board, which thus serves as a "cathode" so as to provide an electrical voltage or potential over the entire surface area of the board necessary to electrically attract the oppositely electrically charged copper ions in the electroplating solution, and copper anodes are connected to the positive source terminal and immersed into the acidic electroplating solution to provide the copper ions, and the board is maintained in this solution for a period of time sufficient to attract the copper ions to and build up the thickness of copper on the exposed portions of the board, not covered by the resist material, including the walls of the through-holes. This electroplating is continued until a thickness within the range of 0.0005 to 0.0050 inches, suitably 0.0014–0.0025 inches, is obtained. The foregoing electroplating requires immersion of the board for a period of 30 minutes to 4 hours at a temperature of 65° to 80° F. as represented at W.

The plated board is then rinsed in water at Step X for 1 to 3 minutes and then carried over to the next step, Z. However, it may be desirable as an option to immerse the board in a mildly caustic solution, suitably sodium hydroxide at this stage as an intermediate step. At this point the plated board is carried over and immersed in an alkaline stripper solution at Z for removing the plating resist coating, which it is recalled covers a portion of the thin electroless copper layer initially applied to the base. This stripper is a caustic solution, suitably sodium hydroxide, typically 3–6 percent weight, or MacDermid 9210T stripper or Dynachem 66H, which are believed to be butyl cellosolve with surfactants in a caustic solution. Typical immersion time is on the order of 1 to 9 minutes, dependent on variables including the resist being stripped. As an alternate, a potassium hydroxide solution, also 3 to 6 percent by weight, may be employed as a stripper solution.

As the circuit board emerges from Step Z, all of the copper areas carried by the substrate are exposed and form an embossed pattern of electroplated copper conductors, the depressed areas consisting of the thin electrolessly deposited copper of the initially applied thin layer. The board is then immersed in water at AA and then moved over and immersed into a bath containing acid, suitably Sulfuric acid in the percentage of 15–18 percent by volume, for coating the board with material to be dragged into the etchant, for approximately 1–3 minutes duration, as is represented at AB.

The board is subsequently immersed in a copper etchant bath at AC. The etchant etches or attacks all the exposed copper but primarily removes the newly uncovered portions of the thin electrolessly deposited copper layer which was first deposited on the base material. Simultaneously however, the etchant attacks to an almost indiscernible degree the electroplated copper conductors which were built up by electroplating, but attacks the latter at a much slower rate, typically less than one-half the rate at which the etchant etches the electrolessly deposited copper. Hence, very little of the electroplated conductor is etched away and there is almost imperceptible or essentially no resultant "undercut" of those conductors in the practice of the invention.

The reason for the difference in etching rates between electroless and electroplated copper relates to the difference in their physical characteristics. It should be recognized that the term "electroless copper" is used herein to denote copper which is deposited onto a substrate from a solution which does not require electricity to effect the plating. Conversely, electroplated copper is deposited from an electroplating solution; i.e. one which requires a potential difference and current flow between the object to be plated and a copper anode. Those skilled in the art will recognize that the greater porosity of the electroless copper, in comparison to electroplated copper, will cause a greater surface area to be exposed when the two types of copper are immersed in an etchant. Hence, for a given acid etchant, the electroless copper is chemically attacked and removed at a faster rate than the electroplated copper.

An additional function of the etchant is to remove excess catalyst, which was introduced to the board during the electroless copper deposition steps as part of the preparation therefor in Steps K and M. The presence of the catalyst could result in a loss of electrical quality, decreased insulation resistance, should it remain on the board. It is believed that those copper etchants containing oxidizing agents provide this additional function. A suitable etchant solution for the foregoing purposes is Sulfuric acid and Peroxide solution. A commercially available solution is one which contains 16–18 percent by volume $H_2SO_4$, 5–6 percent "BPX2", $1\frac{1}{2}$–3 percent Cobrasol III ($H_2O_2$). The etchant is maintained at a temperature of 75–110 degrees F. with immersion for a time of approximately 2 minutes or less. The etchant solution is agitated during the immersion to ensure uniformity and consistency of etching throughout the board. As soon as the exposed thin copper layer is removed the board is carried out and immersed in a water rinse, as represented at AC in the figure. The completed boards are then rinsed and dried as represented at AD-1 and AD-2.

It is noted that the mild acidic baths, as at V and AB in the aforedescribed process, have the function of "dragging in" acid into a subsequent acidic bath, such as at W and AC, respectively. This effectively replenishes acid in the subsequent acid based bath removed as coating liquid each time a board exits the subsequent bath. A less sophisticated alternative is to more frequently monitor the acidity of the subsequent bath and to manually replenish the acid content of the baths. A mild alkaline bath 1 precedes the alkaline bath at Y. Likewise, a less desirable alternative is to remove the mild alkaline bath and manually replenish bath Y with alkaline material from time to time as its alkalinity drops below desired levels. Thus the mild acid and alkaline baths are not necessary to the practice of the invention and in less sophisticated applications of the invention and may be omitted, but their inclusion is preferred. Further, as is good practice, the boards or the solution are agitated during immersion in the various liquids to assist uniformity of treatment. This is accomplished by the apparatus.

EXAMPLE I

The foregoing process may be summarized by a specific Example I, omitting the rinses from this summary, reference being made to the preceding description where necessary:

Step A Laminate G-10 with resin layers of nitrile rubber of 0.0008 inch thick (average) semi-cured to 75 grams load on Erickson tester.

Step E Oxidizer: Chromic acid flakes, 100 gms/liter of solution, and 30% Sulfuric Acid, $H_2SO_4$, by volume at 120 degrees F. for between 2 and 8 minutes.

Step F Neutralizer: Sodium bisulfite in water, 1 pound per gallon concentration at temperature 75 degrees for between 1 and 3 minutes.

Step H Surfactant: Enplate 50104.

Step J Bath: 30 percent hydrochloric acid solution at 75 degrees F. for between 1 and $1\frac{1}{2}$ minutes.

Step K Catalyst: Tin palladium colloidial complex at room temperature for between 2 and 6 minutes.

Step M Accelerator/catalyst: Hydrochloric acid, water, tin and palladium at room temperature for between 2 and 6 minutes.

Step O Electroless copper: Formaldehyde and caustic solution including copper sulfate salt with appropriate stabilizers and complexes such as EDTA.

Step R Resist: Grace 7263A alkaline strippable ultraviolet light curable.

Step S Bath: Phosphoric acid 20 percent by volume in $H_2O$ at 75 degrees F. for between 1 and 3 minutes.

Step U Electroclean or second acid soak cleaner: Electroclean MacDermid 9268, 5–10 percent by volume in water for between 3 and 10 seconds at current of 5 ASF.

Step V Bath: Sulfuric acid 10 percent by volume in water for 2 minutes at 75 degrees F.

Step W Electroplate: 10 oz. copper sulfate pentahydrate per gallon solution, 60 ppm chloride per gallon solution, 23 oz. sulfuric acid per gallon solution, 1 percent by volume conventional additives, remainder water. Solution temperature 75 degrees F. 70 minutes at plating current of 35 ASF.

Step Z Stripper: Sodium hydroxide 5 percent by weight in water for between 1 and 3 minutes at temperature 130 to 150 degrees F.

Step AB sulfuric acid 17 percent by volume in water for between 1 and 3 minutes at temperature 75 degrees F.

Step AC Sulfuric acid 17 percent by volume, BPX2 $5\frac{1}{2}$ percent by volume, Coborosol III 2 percent by volume, water remainder at 110 degrees F. for 2 minutes.

EXAMPLE II

By way of further example, certain portions of the conductors or through-holes may be plated with a noble metal, such as gold, and, alternatively or in combination, a solder coating is desirably applied to the through-hole walls as well as the pad areas surrounding the holes to facilitate the soldering of electrical components inserted and supported by the holes on the circuit board. Thus, taking the board produced under the preceding Example I through Step AD-2, as represented at Step AE, a solder mask can be applied covering all of the conductor portions and insulative portions of the board except those few areas in which a solder coating is desired. A suitable mask is 159NG material purchased from the Grace Company, which is applied as a liquid and which is hardened or cured, as variously termed, be exposure to ultraviolet light. Obviously, heat curable masks may be substituted. The masked board is immersed, by way of example, into a solder solution consisting of the perfect eutectic, 63 percent tin and 37 percent lead, in the liquid state, as represented at AF. As those experienced in the art recognize, the chief component of solder, tin, it a very expensive metal. Hence, by limiting the application of solder to those areas of the board actually requiring it, this expensive metal is not wasted, in comparison to those prior art processes which employ solder as a mask over the copper for processing, as represented by the subtractive process, and achieves a better result than those processes in which the solder alloy is applied by electroless plating or electroplating which, as is known, is inferior as a solder than a coating obtained by contact with the eutectic solder alloy in the liquid state.

EXAMPLE III

In other applications the customer desired the conductor area of the board plated with tin rather than the solder. Hence, considering a board produced according to the preceding steps of A through AE in Example II in which the board contains the desired solder mask covering the prescribed areas, the board is immersed in an electroless tin plating solution represented at AG in the figure. A suitable solution is ME-1010, manufactured by Circuit Services, with immersion for a period of 10 minutes at a temperature of 100 to 120 degrees F. to achieve a coating of approximately 0.000050 inches.

EXAMPLE IV

Other conventional applications require delivery of a circuit board which has the surfaces masked in the negative image of a prescribed pattern for later soldering operations with the exposed copper areas protected by an inexpensive covering such as lacquer. Thus, proceeding with a board produced in accordance with a preceding Example II, the board subsequent to Step AE is dipped in a lacquer solution represented at AH. The lacquer comprises any conventional type.

EXAMPLE V

Still other customer applications require that the completed circuit boards have all copper surfaces covered with a protective metal, such as tin, and a solder covering the tin. Thus considering a circuit board produced according to the preceding Example I, following Step AD-2, the board is immersed in an electroless tin plating solution, as represented at AI. The solution and the immersion time is the same as set forth in Example III. That step is followed by immersion into molten solder in the solder dip and level step represented at AF.

EXAMPLE VI

Frequently the customer may desire an overpattern plate. This is accomplished by modifying the steps of Example I to include the overpattern plate of Step Y in between Steps W and X. This includes tin/lead, nickel/tin, nickel/gold, or tin.

EXAMPLE VII

In other applications it may be desired to apply a lacquer coating, Example IV, or an electroless tin plating, Example III, or a solder dip and level, Example II, over the entire board, in which case a solder mask is not necessary. In that case, the process of each of Examples II, III, and IV may be repeated, omitting the step AE.

Figure 2:
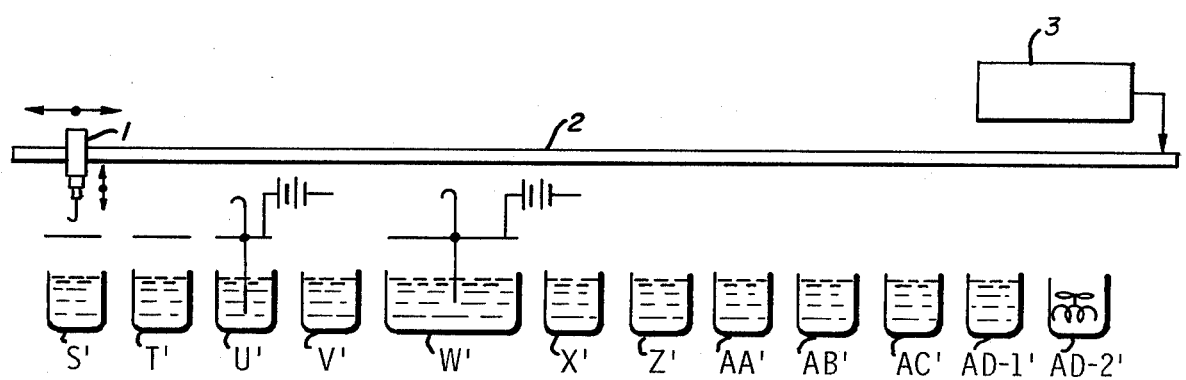
FIG. 2 symbolically illustrates an automatic plating line apparatus for practicing the above-identified process.

At this point in the description, brief reference is made to the relationship of this flow diagram to the apparatus for practicing the invention as depicted in FIG. 2, which is described after this specification. The steps represented by S, T, U, V, W, X, Z, AA, AB, AC, AD-1 and AD-2 in FIG. 1 are entirely automated in a continuous in-line process apparatus by means of which the circuit board is placed onto a movable means and is carried forward and immersed sequentially into each of a plurality of the chemical tanks or baths specified and described to perform the operations presented in this flow chart. This eliminates any unnecessary handling of the treated boards, such as would be necessary by moving boards around to different areas in a manufacturing facility to perform individual processes. I represent this apparatus in the flow chart of FIG. 1 by the inclusion of lines of greater thickness.

For convenience and ease of understanding, these tanks are identified by the labels, primed, corresponding to the labels used to identify and describe treatment steps in the flow chart of FIG. 1. Accordingly, there is illustrated tanks 5' and through AD-2'. In practicing the additional examples other intermediate tanks and additional tanks may be added to the line. Conventional methods of filling or emptying these tanks of the chemical ingredients and of monitoring temperature and concentration conventional in chemical processing baths, are not illustrated or described inasmuch as they are known and do not contribute to the understanding of the invention. The apparatus includes an advancing means 1 of any conventional known structure, mounted for movement on a track which passes each tank. The advancing means is moved by conventional motor or timer mechanisms, not illustrated, under control of a programmer 3. Circuit boards are suspended by brackets. The circuit board may be loaded onto the advancing means at one end. The advancing means carries the circuit boards over each of the tanks and then immerses the boards therewithin moving it through the tank, then lifts it out and moves it to the next tank in the depicted chain sequentially.

In the Udylite brand apparatus machine, represented by the schematic, the mechanical operation is such that at timed intervals a lever mechanism moves into position and pushes the circuit boards forward a predetermined number of inches and then withdraws until the lapse of another interval and the forward pushing process repeats so the circuit boards are moved forward in the tank. The machine includes an electrified side rail adjacent the electrocleaning U' electroplating W' baths and the copper covered circuit board is placed in circuit with such electrified rail while moving through this plating bath. The aforedescribed machine is more practical particularly on a production basis for processing a parade of individual circuit boards. Each board is lifted out of one tank and subsequently dipped into and moved through a succeeding tank, and at the conclusion of the cycle the boards exit the tank.

In the carrying out of my invention, it is the essence of my apparatus to include treatment tanks W', Z' and AC' as part of an in-line progression or chain of chemical tanks into which an insulative base substrate covered over with a thin electroless copper layer and masked in the negative of the conductor image ultimately desired on the substrate is sequentially immersed and carried from the former through the latter without the necessity for operator handling.

As is understood by those skilled in the art, the arrangement of tanks and the trolley may be arranged so that circuit boards may be unloaded at an intermediate location for processing away from the chemical baths of this apparatus and then they may be returned and loaded back onto the trolley at the edge which they were removed for further movement through additional chemical baths. Additionally, the apparatus within the scope of my invention may be modified to include additional tanks containing liquid ingredients to permit additional treatment as desired as a continuation of that treatment illustrated or after unloading and reloading the boards.

By way of example, a mild alkaline solution may be included between Steps X and Z in the figure to drag in some caustic liquid into the caustic stripper solution. As is represented by the schematic, I believe there is nothing unique in the construction of the chemical baths or advancing means considered apart from one another. However, the particular chemical baths and the sequence thereof is seen to be a unique combination of my invention to practice the method defined by the flow chart of FIG. 1 to take a resist covered thin copper-insulative laminate board and provide at the end a board covered with a thick copper conductor configuration. In the illustration of FIG. 2, the lengths of the baths are represented as being of various lengths. As is represented in the flow chart of FIG. 1, some chemical immersion is required in some of the baths for a longer period of time than in other of the chemical baths. To accomplish this, either a longer tank is used, such as represented by tank W, or two or more individual tanks may be arranged side by side.

It is also apparent to persons skilled in the art from reading this specification that other more sophisticated process equipment may be available which may maintain chemical tanks in an in-line relationship. However, even in more sophisticated devices, the processing baths, according to the invention, will be located in a continuous in-line stream without the intervention of personnel or handling of the circuit boards and will have boards immersed for the requisite duration.

A variation according to the invention is to use or substitute a resist material in Step R that is strippable in a stripper solution having characteristics of other than an acid or base solution, as such becomes available, and in that eventuality the resist stripper solution in Step Z is of the appropriate characteristics as a substitute for the alkaline type described. Such as substitution retains the benefits of automated in-line continuous processing in the apparatus of the invention.

A related advantage of my invention lies in the salvage of those boards which complete the foregoing process but do not meet the quality standards imposed by inspection as might occur if a plating or etching solution were to temporarily go out of specification for any reason. Those skilled in the art recognize that the insulative base material is relatively expensive. Further, the base has undergone significant initial processing and contains an adhesive layer and has been drilled or pierced to form a large number of through-hole passages. At least that much should desirably be reclaimed at substantial savings. The defective board may then promptly placed in a strong copper etchant solution of the kind used in existing subtractive processes for manufacturing circuit boards, such as an ammoniacal etchant, which is a very strong caustic and relatively quickly removes the electroplated copper as well as the underlying electrolessly deposited copper.

This allows the manufacturer to return the stripped board to the original processing station for immediate reprocessing while the original order is being manufactured. This benefit of my process avoids the problem of partially completing and shipping an order of finished boards and then reordering base material and repeating processing to make up any deficit in the order.

It is difficult for applicant to compare his process with others, such as that presented by Stahl, inasmuch as applicant's process viewed in a vacuum or as a shopping list of steps appears to differ in seemingly simple ways from the prior art. Yet the superior results obtained seem to augur great significance to those "changes" which if earlier available to those skilled in the art would logically have been placed into practice. Thus, one of the existing industry problems with additive type circuit boards is that they fare poorly in industry thermal shock testing, a test accomplished by immersion in molten solder at 500 to 550 degrees F. Failure is usually indicated by tearing away of the conductor in the vicinity of a through-hole connection. The circuit boards produced by my process pass such thermal shock testing as well as pass military tests presented in MIL-P-55110 groups B&C. The boards are essentially free of metal "silvers". The boards produced are of superior line definition with essentially no undercut. The electrical insulation characteristics, such as the resistance between spaced electrical conductors, exceeds 500 megohms. A high peel strength in excess of the industry specification of eight pounds per inch is obtained. Surprisingly, the peel strengths obtained exceeded peel strengths obtained by me from circuit boards produced by certain prior art subtractive processes and additive processes. More surprising to me is that it is found that during subsequent wavesoldering of boards produced by my process the peel strength tends to increase by some fifteen to thirty percent over that obtainable before wavesoldering, whereas with boards produced by subtractive processes known to me, the peel strength during wavesoldering tends to decrease.

Based upon my estimates, the process of the invention produces boards which yield superior overall results and are economically advantageous as compared to both additive and subtractive processes. As the skilled reader recognizes, applicant has fortuitously discovered a specific method of treatment for circuit boards uniquely adapted to in-line processing apparatus which produces a printed circuit board of acceptable industrial quality at a lower per unit cost than the additive type processes with which applicant is familiar, but not having the disadvantage inhering in the subtractive process limiting the line width. Considered piece by piece, my invention includes many old and known elements and procedures which I have adapted in seemingly simple ways to form a complete method and manufacturing technique which the crowded prior art has overlooked, despite the extraordinary number of permissible process variations represented in the prior art, none of which specifically suggest or teach my invention, and my invention might have continued unrecognized in the multitude of knowledge and its benefits unknown without the chance initial selection of the correct elements and steps represented in existing knowledge. Given the teachings of this specification, persons skilled in the art now may ascertain and determine the costs and recognize the advantage in costs and quality of my invention over present additive methods as well as the advantage over subtractive processes, and further, those persons may realize the simplicity of my method and conclude as I have that if others skilled in the art had the invention suggested to them by the prior art, the process I define would have been adopted and placed into use before this time.

Further, based upon the nature of the results and qualities obtained, it appears that I may deduce that printed circuit board made according to my process possess structural differences from prior art circuit boards, but that I am unable presently to definitize or express those structural differences in terms of existing knowledge and they are in essence to me unknown. The only possible description is that the new circuit boards possessing the desirable qualities are the resultant product of the described processes.

It is believed that the foregoing description of the preferred embodiment of my invention is described with sufficient detail as will enable any person skilled in the art to practice and use same without undue experimentation. However, it is expressly understood that the details presented for the foregoing purpose are not intended to limit my invention to those details inasmuch as other equivalent elements may be substituted for those specifically employed, and modifications or improvements may be made, as is recognized by those skilled in the art upon reading this specification, all of which embody my invention. For example, although the foregoing process is described in connection with a two-sided through-hole board it is apparent that it can be used with a single-sided board or to make multilayer circuit boards, the latter of which comprises two or more printed circuit boards which are bonded together in a stack as is known. Accordingly, it is specifically requested that my invention be broadly construed within the full spirit and scope of the appended claims.

What I claim is:

1. The process of manufacturing a printed circuit board of the type containing a predetermined pattern of electrical conductors adherent to at least one surface thereof by a peel strength of at least 8 pounds per inch and plated through-holes which include, in the order specified, the steps of:
   (a) forming a laminate structure containing:
      a relatively flat base of electrically insulative material;
      a layer of an semi-cured adhesive material of the type which secures electroless copper to said base, said layer being of a thickness in the range of 0.0005 inches to 0.0020 inches over the surfaces intended to support said predetermined pattern of copper conductors;
      a layer of electroless copper plating overlying said adhesive layer and secured to said base thereby, said electroless copper having a thickness within the range of 15 to 50 millionths of an inch; and
      a plurality of passages through said laminate structure and said layers containing passage walls covered by electroless copper connected to said layer of electroless copper;
   (b) securing a resist material over the surfaces of said structure in the negative image of the predetermined copper conductor pattern intended to be supported thereon, leaving exposed portions of said electroless copper in the positive image of the desired conductor pattern, said resist material being of a substance that is alkaline strippable;
   (c) applying an acid solution to said resist covered laminate structure for cleaning said structure;
   (d) immersing said laminate structure in an acid based copper electroplating solution and electroplating copper onto the exposed electroless copper for a duration sufficient to deposit electroplated copper of a thickness within the range of 0.0005 inches to 0.005 inches;
   (e) applying an alkaline stripper solution to said plated laminate structure containing said electroplated copper for removing said resist material to uncover said electroless copper whereby an embossed pattern of metal is presented;
   (f) applying an etchant solution to said laminate structure for a predetermined interval to remove said uncovered electroless copper and thereby expose underlying portions of said adhesive layer without removing significant amounts of said electroplated copper;
   whereby a circuit board containing a predetermined copper conductor pattern and plated through-holes is formed.

2. The process as defined in claim 1 wherein said step (c) of applying an acid solution to said resist covered laminate structure for cleaning includes the steps of:
   (c1) immersing said laminate structure in a first acid cleaning solution and then
   (c2) immersing said laminate in an acid based electro-cleaning solution for electrolytically removing a portion of electroless copper uncovered by said resist material.

3. The process as defined in claim 1 or 2 wherein said step (b) of securing a resist material over the surfaces of said structure includes the steps of:
   (b1) applying a coating of resist material in the uncured state, and
   (b2) exposing said resist material to ultraviolet light to cure said resist material.

4. The process as defined in claim 1 wherein said step (b) of securing a resist material over the surfaces of said structure includes the steps of:
   (b1) applying a coating of resist material in the uncured state, and
   (b2) exposing said resist material to heat to cure said resist material.

5. The process as defined in claim 2 which includes:
   (g) the step of immersing said board with an acid solution intermediate said steps (c) and (d).

6. The process as defined in claim 1 further including:
   (h) the step of immersing said laminate in an acid based metal electroplating solution for electroplating a metal other than copper to cover said electroplated copper with another electroplated metal intermediate said steps (d) and (e).

7. The process as defined in claims 1, 2 or 5, including the steps of:
   (i) rinsing said board subsequent to step (f) to remove traces of etchant; and
   (j) drying said board.

8. The method of manufacturing a printed circuit board from a relatively flat insulative board which includes the steps of:
   (1) applying an semi-cured adhesive layer to the treated surfaces of said board in a thickness in the range of 0.0005 to 0.0002 inches for receiving thereon an electroless copper plating material;
   (2) forming a hole pattern through said board;
   (3) lightly abraiding the surfaces of said adhesive covered board;
   (4) preparing said adhesive covered board surface to receive an electroless copper plating;
   (5) immersing said board in an electroless copper plating solution to form an electroless copper layer over said adhesive layer of a thickness within the range of 15 to 50 millionths of an inch and to form an electroless copper layer on the walls of said holes and thereafter rinsing and drying said board;

(6) attaching an ultraviolet light curable alkaline strippable resist material over the surfaces of said circuit board in the negative image of the desired circuit to be formed thereon, said resist material being resistant to acid and plating;

(7) coupling said treated board to a chemical treating apparatus, said apparatus having means for automatically and sequentially immersing said board into a plurality of tanks in sequence for predetermined durations between a loading and an unloading position, including in the following baths in the order stated:
   (7a) an acidic cleaning solution;
   (7b) an acidic electrocleaning solution for removing a small amount of electroless copper;
   (7c) a mildly acidic bath to coat the board with chemical acid;
   (7d) an acidic electroplating copper solution to electroplate copper over the exposed portions of electroless copper to a thickness in the range of 0.0005 to 0.005 inches;
   (7e) a caustic stripper solution for an interval for removing resist material from the board;
   (7f) a mildly acidic bath to coat the board with chemical acid; and
   (7g) a copper etching solution to differentially etch the exposed copper for a duration sufficient to remove exposed electroless copper without significant removal of electroplated copper.

9. The invention as defined in claim 8 further including, intermediate 7(d) and 7(e), a tank containing:
   (7h) an acidic electroplating metal solution, other than copper, for depositing a covering layer of metal over electroplated copper.

10. The invention as defined in claim 8 wherein said step (4) of preparing said adhesive covered board surface to receive an electroless copper plating includes the steps of:
   (4a) immersing said board in an oxidizing solution;
   (4b) immersing said board in a neutralizing solution;
   (4c) immersing said board in a surfactant solution;
   (4d) immersing said board in an acid solution;
   (4e) immersing said board in a catalyst solution;
   (4f) immersing said board in an accelerator-catalyst solution.

11. The invention as defined in claim 10 wherein said copper etchant solution additionally removes catalyst to ensure electrical insulation integrity of exposed board surfaces.

12. A method of making a printed circuit board having a predetermined copper conductor configuration of a thickness in the range of 0.0005 to 0.005 inches on at least one surface and copper conductor walled through-hole passages between the surfaces thereof from a laminate structure comprising an insulative laminate base, a layer of semi-cured adhesive material on each of the opposed front and back surfaces thereof intended to have a conductor configuration thereon, of the type which secures electroless copper, through-hole passages, a layer of electroless copper of a thickness in the range of 15 to 50 millionths of an inch on the surfaces covered by said adhesive layer and electroless copper covering said through-hole passage walls and an electroplating resist of an alkaline strippable acid resistant material covering the surfaces on which a conductor configuration is desired in the negative of the image of the desired conductor configuration leaving exposed those areas of electroless copper that are in the positive image of the desired conductor configuration which includes the following steps in the order presented:
   immersing said resist covered structure in an acid cleaning solution for cleaning said structure;
   immersing said acid cleaned structure in an acidic electrocleaning solution and coupling an electrical source thereto for removing between one and five millionths of an inch of electroless copper from the exposed portions of said electroless copper on said structure;
   immersing said laminate structure in an acidic copper electroplating solution and coupling an electrical source to said structure for electroplating acid copper onto the exposed portions of said electroless copper and retaining said structure in said solution for an interval sufficient to produce a plating of electroplated copper of a thickness in the range of 0.0005 to 0.005 inches;
   immersing said structure containing said electroplated copper in an alkaline stripping solution for an interval of time to remove said cured resist material and expose an embossed surface of metal in which the electroplated copper forms a raised portion of the embossment and is in the positive image of said desired conductor configuration and in which the electroless copper forms the recessed portion of said embossment;
   immersing said structure containing said embossed surface of copper material in a copper etchant solution for differentially etching said electroless copper and said electroplated copper for an interval sufficient to remove the electroless copper in the recesses of said embossment without significant removal of said electroplated copper.

13. The process of manufacturing a printed circuit board of the type containing a predetermined pattern of electrical conductors on at least one surface thereof and plated through-holes which include, in the order specified, the steps of:
   (a) forming a laminate structure containing:
      a relatively flat base of electrically insulative material;
      a layer of an semi-cured adhesive material of the type which secures electroless copper to said base, said layer being of a thickness in the range of 0.0005 inches to 0.0020 inches over the surfaces intended to support said predetermined pattern of copper conductors;
      a layer of electroless copper plating overlying said adhesive layer and secured to said base thereby, said electroless copper having a thickness within the range of 15 to 50 millionths of an inch, and traces of catalyst under said plating; and
      a plurality of passages through said laminate structure and said layers containing passage walls covered by electroless copper connected to said layer of electroless copper;
   (b) securing a resist material over the surfaces of said structure in the negative image of the predetermined copper conductor pattern intended to be supported thereon, leaving exposed portions of said electroless copper in the positive image of the desired conductor pattern;
   (c) applying an acid solution to said resist covered laminate structure for cleaning said structure;

(d) immersing said laminate structure in an acid based copper electroplating solution and electroplating copper onto the exposed electroless copper for a duration sufficient to deposit electroplated copper of a thickness within the range of 0.0005 inches to 0.005 inches;

(e) applying a stripper solution to said plated laminate structure containing said electroplated copper for removing said resist material to uncover said electroless copper whereby an embossed pattern of metal is presented;

(f) applying an etchant solution to said laminate structure for a predetermined interval to remove said uncovered electroless copper and thereby expose underlying portions of said adhesive layer without removing significant amounts of said electroplated copper and for removing traces of said catalyst;

whereby a circuit board containing a predetermined copper conductor pattern and plated through-holes is formed.

14. The process as defined in claim 13 wherein said step (c) of applying an acid solution to said resist covered laminate structure for cleaning includes the steps of:

(c1) immersing said laminate structure in a first acid cleaning solution and then (c2) immersing said laminate in an acid based electrocleaning solution for electrolytically removing a portion of electroless copper uncovered by said resist material.

15. The process as defined in claim 13 or 14 wherein said step (b) of securing a resist material over the surfaces of said structure includes the steps of:

(b1) applying a coating of resist material in the uncured state, and (b2) exposing said resist material to ultraviolet light to cure said resist material.

16. The process as defined in claim 15 wherein said step (b) of securing a resist material over the surfaces of said structure includes the steps of:

(b1) applying a coating of resist material in the uncured state, and (b2) exposing said resist material to heat for curing said resist material.

17. The process as defined in claims 13 or 14 including the steps of:

(i) rinsing said board subsequent to step (f) to remove traces of etchant; and (j) drying said board.

18. The method of manufacturing a printed circuit board from a relatively flat insulative board which includes the steps of:

(1) applying an semi-cured adhesive layer to the treated surfaces of said board in a thickness in the range of 0.0005 to 0.002 inches for receiving thereon an electroless copper plating material;

(2) forming a hole pattern through said board;

(3) lightly abraiding the surfaces of said adhesive covered board;

(4) preparing said adhesive covered board surface to receive an electroless copper plating, including application of a catalyst;

(5) immersing said board in an electroless copper plating solution to form an electroless copper layer over said adhesive layer of a thickness within the range of 15 to 50 millionths of an inch and to form an electroless copper layer on the walls of said holes and thereafter rinsing and drying said board;

(6) attaching a strippable resist material over the surfaces of said circuit board in the negative image of the desired circuit to be formed thereon, said resist material being resistant to acid and plating;

(7) coupling said treated board to a chemical treating apparatus, said apparatus having means for automatically and sequentially immersing said board into a plurality of tanks in sequence for predetermined durations between a loading and an unloading position, including in the following baths in the order stated:

(7a) an acidic cleaning solution;

(7b) a mildly acidic bath to coat the board with chemical acid;

(7c) an acidic electroplating copper solution to electroplate copper over the exposed portions of electroless copper to a thickness in the range of 0.0005 to 0.005 inches;

(7d) a stripper solution for an interval for removing resist material from the board;

(7e) a copper etching solution to differentially etch the exposed copper for a duration sufficient to remove exposed electroless copper without significant removal of electroplated copper and to remove traces of catalyst.

19. The invention as defined in claim 18 wherein said step (4) of preparing said adhesive covered board surface to receive an electroless copper plating includes the steps:

(4a) immersing said board in an oxidizing solution;

(4b) immersing said board in a neutralizing solution;

(4c) immersing said board in a surfactant solution;

(4d) immersing said board in an acid solution;

(4e) immersing said board in a catalyst solution;

(4f) immersing said board in an accelerator-catalyst solution.

20. A method of making a printed circuit board having a predetermined copper conductor configuration of a thickness in the range of 0.0005 to 0.005 inches on at least one surface and copper conductor walled through-hole passages between the surfaces thereof from a laminate structure comprising an insulative laminate base, a layer of semi-cured adhesive material on each of the opposed front and back surfaces thereof intended to have a conductor configuration thereon, of the type which secures electroless copper, through-hole passages, a layer of electroless copper of a thickness in the range of 15 to 50 millionths of an inch on the surfaces covered by said adhesive layer applied by a process including application of a catalyst and electroless copper covering said through-hole passage walls and an electroplating resist of an acid resistant material covering the surfaces on which a conductor configuration is desired in the negative of the image of the desired conductor configuration leaving exposed those areas of electroless copper that are in the positive image of the desired conductor configuration which includes the following steps in the order presented:

immersing said resist covered structure in an acid cleaning solution for cleaning said structure;

immersing said laminate structure in an acidic copper electroplating solution and coupling an electrical source to said structure for electroplating acid copper onto the exposed portions of said electroless copper and retaining said structure in said solution for an interval sufficient to produce a plating of electroplated copper of a thickness in the range of 0.0005 to 0.005 inches;

immersing said structure containing said electroplated copper in a stripping solution for an interval of time to remove said resist material and expose an embossed surface of metal in which the electroplated copper forms a raised portion of the embossment and is in the positive image of said desired conductor configuration and in which the electroless copper forms the recessed portion of said embossment;

immersing said structure containing said embossed surface of copper material in a copper etchant solution for differentially etching said electroless copper and said electroplated copper for an interval sufficient to remove the electroless copper in the recesses of said embossment without significant removal of said electroplated copper and for removing traces of catalyst.

21. The invention as defined in claim 20 which includes the step intermediate said steps of cleaning and electroplating of immersing said acid cleaned structure in an acidic electrocleaning solution and coupling an electrical source thereto for removing between one and five millionths of an inch of electroless copper from the exposed portions of said electroless copper on said structure.

22. The circuit board produced according to the process of claim 20.
23. The circuit board produced according to the process of claim 19.
24. The circuit board produced according to the process of claim 13.
25. The circuit board produced according to the process of claim 10.
26. The circuit board produced according to the process of claim 8.
27. The circuit board produced according to the process of claim 1.

* * * * *